(12) United States Patent
Shaker et al.

(10) Patent No.: US 11,698,391 B1
(45) Date of Patent: Jul. 11, 2023

(54) SYSTEM AND METHOD FOR PERFORMING LOSSLESS COMPRESSED SERIAL DECODING

(71) Applicant: Keysight Technologies, Inc., Santa Rosa, CA (US)

(72) Inventors: Joseph D. Shaker, Colorado Springs, CO (US); Allen Montijo, Colorado Springs, CO (US); Matthew S. Holcomb, Colorado Springs, CO (US); Connor P. McKay, Colorado Springs, CO (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 221 days.

(21) Appl. No.: 17/334,136

(22) Filed: May 28, 2021

(51) Int. Cl.
*G01R 13/02* (2006.01)
*G01R 31/317* (2006.01)
*G01R 13/24* (2006.01)
*G06T 11/20* (2006.01)
*H04L 43/045* (2022.01)
*H04L 43/106* (2022.01)
*G01R 13/30* (2006.01)

(52) U.S. Cl.
CPC ..... *G01R 13/0218* (2013.01); *G01R 13/0254* (2013.01); *G01R 13/0272* (2013.01);
(Continued)

(58) Field of Classification Search
CPC ............ G01R 13/0218; G01R 13/0281; G01R 31/317; G01R 13/245; G01R 13/0254;
(Continued)

(56) References Cited

U.S. PATENT DOCUMENTS 5,896,552 A 4/1999 Kowert et al.
6,584,125 B1 * 6/2003 Katto ................... H04N 21/242
370/537
(Continued)

FOREIGN PATENT DOCUMENTS

CN 103353543 A 10/2013
CN 107589289 A 1/2018

OTHER PUBLICATIONS

English translation of CN103353543A.
(Continued)

*Primary Examiner* — John J Tabone, Jr.

(57) ABSTRACT

A system and method are provided for displaying input signals from a DUT on a display screen. The method includes sending a data stream of digitized data received from the DUT to an FPGA for serial decoding; receiving decoded symbols from the FPGA; identifying valid symbols among the decoded symbols indicating transitions between the decoded symbols; storing the valid symbols with corresponding time-tags as valid packets in memory, and discarding ones of the decoded symbols occurring between the valid symbols; and plotting on the display screen the valid packets occurring between beginning and ending valid packets of the stored valid packets. The beginning valid packet has a corresponding time-tag occurring immediately before a first point time-tag associated with a left edge of the display screen, and the ending valid packet has a corresponding time-tag occurring at or immediately before a last point time-tag associated with a right edge of the display screen.

20 Claims, 4 Drawing Sheets

(52) U.S. Cl.
CPC ....... *G01R 13/0281* (2013.01); *G01R 13/245* (2013.01); *G01R 13/305* (2013.01); *G01R 31/317* (2013.01); *G06T 11/206* (2013.01); *H04L 43/045* (2013.01); *H04L 43/106* (2013.01); *G06T 2200/24* (2013.01)

(58) Field of Classification Search
CPC . G01R 13/0272; G01R 13/305; G06T 11/206; G06T 2200/24; H04L 43/106; H04L 43/045
USPC .......................... 714/723, 763, 773, 776, 812
See application file for complete search history.

(56) References Cited

U.S. PATENT DOCUMENTS

| | | |
|---|---|---|
| 7,173,943 B1 | 2/2007 | Borchew et al. |
| 7,332,929 B1 | 2/2008 | Normoyle et al. |
| 10,955,461 B2 | 3/2021 | Hsu et al. |
| 2006/0093027 A1* | 5/2006 | Draving .................. H04L 1/205 375/226 |
| 2012/0007874 A1* | 1/2012 | Holcomb ........... G01R 13/0227 345/545 |
| 2012/0274313 A1* | 11/2012 | Holcomb ............. G01R 13/029 324/121 R |
| 2013/0207641 A1* | 8/2013 | Timm ................ G01R 13/0272 324/121 R |
| 2019/0207830 A1* | 7/2019 | Chabreck ............. G01R 13/245 |

OTHER PUBLICATIONS

English translation of CN107589289A.
"Serial Bus Options for InfiniiVision X-Series Oscilloscopes", Sep. 27, 2017, https://www.keysight.com/us/en/assets/7018-02747/data-sheets/5990-6677.pdf.

* cited by examiner

SYSTEM AND METHOD FOR PERFORMING LOSSLESS COMPRESSED SERIAL DECODING

BACKGROUND

Oscilloscopes may include application specific integrated circuits (ASICs) or other circuitry for processing input digitized data, and field-programmable gate arrays (FPGAs) for performing serial decoding of the digitized data off-chip. That is, the FPGA is configured to decode the protocol of serial data, generate decoded symbols corresponding to the serial data according to the protocol, and send the decoded symbols back to the ASIC. The ASIC stores the decoded symbols in memory for readout aligned with a trigger signal, for example. The readout may be sent to a companion central processing unit (CPU), which controls plotting of the decoded symbols on a display screen, along with data lines. However, because the amount of memory for storing the decoded symbols in the oscilloscope is limited, it is difficult to verify and/or debug some applications.

Conventional oscilloscopes store serial data densely, meaning that each decoded symbol is stored in the oscilloscope memory with corresponding times. For example, when the decoded symbol at t=0 is A, the decoded symbol at t=10 is B, and the decoded symbol at t=15 is C, the decoded symbol A is stored 10 times, the decoded symbol B is stored 5 times, etc. The densely stored decoded symbols enable easy random access into the memory for readout. However, because every decoded symbol is stored along with a corresponding time, the densely stored decoded symbols occupy a large amount of memory.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
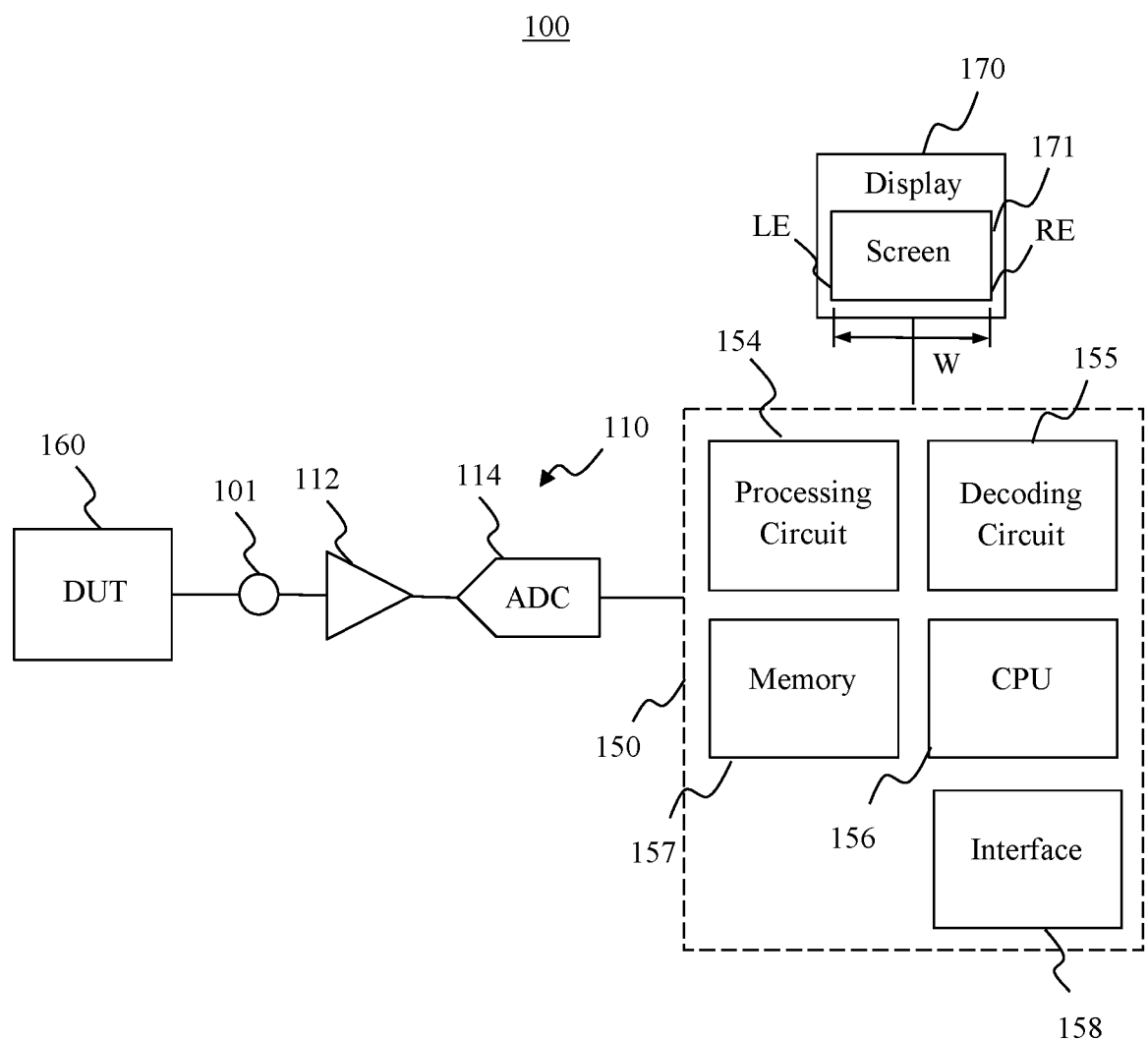
FIG. 1 is a simplified block diagram of a test system for displaying input signals from a device under test (DUT) using compressed decoded symbols, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one having ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

Various embodiments are directed to a test system and method that use a field-programmable gate array (FPGA) or other off-chip solution to perform serial decoding of digitized data. The decoded symbols indicating transitions between temporally adjacent decoded symbols are stored with corresponding time-tags (timestamps), while remaining decoded symbols are discarded. This provides lossless compression of the decoded symbols, and effectively stretches the available memory. By storing the decoded symbols indicating transitions with time-tags, and discarding the remaining decoded symbols, the various embodiments vastly reduce the amount of memory needed, especially for slow serial protocols, such as Inter-Integrated Circuit (I2C) or Serial Peripheral Interface (SPI) protocols, for example. This results in some increased complexity in bookkeeping and readout, since packets stored into memory are no longer necessarily uniformly spaced in time.

According to a representative embodiment, a method is provided for displaying input signals from a DUT on a display screen. The method includes sending a data stream of digitized data received from the DUT to a decoding circuit for serial decoding; receiving decoded symbols from the decoding circuit corresponding to the digitized data; identifying valid symbols among the decoded symbols indicating transitions between the decoded symbols; storing the valid symbols with corresponding time-tags as valid packets in a memory, and discarding ones of the decoded symbols occurring between the valid symbols; and plotting on the display screen the valid symbols from the valid packets from a beginning valid packet of the stored valid packets to an ending valid packet of the stored valid packets, together with duplicate decoded symbols repeating the valid symbols from the valid packets, respectively, between the valid packets. The beginning valid packet has a corresponding time-tag occurring immediately before a first point time-tag associated with a left edge of the display screen, and the ending valid packet has a corresponding time-tag occurring at or immediately before a last point time-tag associated with a right edge of the display screen.

Accordingly to another representative embodiment, a system is provided for displaying input signals from a DUT. The system includes a display screen; a decoding circuit configured to serially decode a data stream; a processing circuit configured to receive digitized data from the DUT, and to send the digitized data as the data stream to the decoding circuit for the serial decoding; and a central processing unit (CPU). The processing circuit includes a time-tag counter configured to generate time-tags; a serial decode compressor configured to receive decoded symbols from the decoding circuit corresponding to the serially decoded data, identify valid symbols among the decoded symbols indicating transitions between the decoded symbols, store the valid symbols with corresponding time-tags from the time-tag counter in a memory as valid packets, discard ones of the decoded symbols occurring between the valid symbols, receive a trigger signal indicating occurrence of a triggering event, and associate the trigger signal with a trigger time-tag from the time-tag counter; a readout manager configured to derive a first point time-tag from the trigger time-tag, the first point time-tag indicating a time corresponding to a left edge of the display screen, and derive a last point time-tag from the first point time-tag and a desired duration of a read-out, the last point time-tag indicating a second time corresponding to a right edge of the display screen; and a serial readout engine configured to read the memory backward from an address of a last valid packet of the stored valid packets to identify a beginning valid packet occurring before the first point time-tag, and read the memory forward from the beginning valid packet to identify an ending valid packet of the stored valid packets occurring at or immediately before the last point time-tag. The CPU is configured to plot on the display screen the valid packets, occurring from the beginning valid packet to the ending valid packet, together with duplicate decoded symbols repeating the valid symbols from the valid packets, respectively, between the valid packets.

FIG. 1 is a simplified block diagram of a test system for displaying input signals from a DUT using compressed decoded symbols, according to a representative embodiment.

Referring to FIG. 1, test system 100 may be an oscilloscope, for example, having one or more input channels for providing serialized digital data, indicated by representative input channel 110. In alternative embodiments, the test system 100 may be any test instrument that provides serialized digital data, such as an equivalent-time digitizer, for example. In the depicted embodiment, the input channel 110 is an analog channel that includes a port 101 for receiving a signal under test (SUT) output by a DUT 160 as an input signal, an amplifier 112 for amplifying the input signal, and an analog to digital converter (ADC) 114 for sampling and digitizing the input signal. In alternative embodiments, the input channel 110 may be a digital channel (1-bit logic channel), in which case the ADC 114 is not needed, as would be apparent to one having ordinary skill in the art. The SUT may be generated by the DUT 160 or output by the DUT 160 in response to a stimulus signal, for example. The test system 100 further includes a processing unit 150 for processing the digitized signal received from the input channel 110, making various measurements, displaying the digitized signal and/or measurement results, and performing the various processes discussed below.

Generally, the test system 100 (e.g., an oscilloscope) acquires and stores data received from the DUT 160. In response to occurrence of a predefined trigger, the test system 100 stops storing data, and reads out and plots information relative to the trigger on a display 170. The period of receiving and storing data to stopping in response to the trigger may be referred to as an "acquisition."

In the depicted embodiment, the processing unit 150 includes processing circuit 154, decoding circuit 155, central processing unit (CPU) 156, memory 157 and interface 158, for example, and interfaces with the display 170. The processing circuit 154, the decoding circuit 155 and/or the CPU 156 implement methods of displaying input signals from the DUT 160 during an acquisition using compressed decoded symbols, and may be configured to perform and/or control all or a portion of the steps of the process shown in FIG. 4, for example. In various embodiments, the processing circuit 154 and the decoding circuit 155 may include one or more field-programmable gate arrays (FPGAs) and application specific integrated circuits (ASICs), as discussed below, or combinations thereof, using any combination of hardware, software, firmware, hard-wired logic circuits, or combinations thereof. Alternatively, or in addition, the processing circuit 154 and decoding circuit 155 may include one or more microprocessors, computer processors and/or digital signal processors (DSPs). Each of the processing circuit 154, the decoding circuit 155 and the CPU 156 may include its own processing memory (not shown) for storing computer readable code that enables performance of the various functions described herein.

The memory 157, as well as other memories and databases, may be any type or combination of tangible and non-transitory storage media (e.g., as compared to transitory propagating signals), including random-access memory (RAM), read-only memory (ROM), flash memory, static RAM (SRAM), dynamic RAM (DRAM), registers, a hard disk, a removable disk, tape, floppy disk, blu-ray disk, or universal serial bus (USB) driver, or any other form of storage medium known in the art, for example. Memories may be volatile or non-volatile, secure and/or encrypted, unsecure and/or unencrypted, and may be embedded within the processing circuit 154, the decoding circuit 155, and/or the CPU 156, or separate from them, without departing from the scope of the present teachings.

The interface 158 may include a user interface and/or a network interface for providing information and data output from the processing circuit 154, the decoding circuit 155, the CPU 156 and/or the memory 157 to the user and/or for receiving information and data at the processing circuit 154, the CPU 156 and/or the memory 157 input by the user. That is, the interface 158 enables the user to enter data and to control or manipulate aspects of the signal display process, and also enables the CPU 156 to indicate the effects of the user's control or manipulation. The interface 158 may include one or more of ports, disk drives, wireless antennas, or other types of receiver circuitry. The interface 158 may further connect one or more user interfaces, such as a mouse, a keyboard, a mouse, a trackball, a joystick, a microphone, a video camera, a touchpad, a touchscreen, voice or gesture recognition captured by a microphone or video camera, for example, or any other peripheral or control to permit user feedback from and interaction with the processing unit 150.

The display 170 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 170 includes a display screen 171. The display 170 and/or the processing unit 150 may include display interface(s), in which case the display 170 may provide a graphical user interface (GUI) on for displaying and receiving information to and from the user via the display screen 171.

Figure 2:
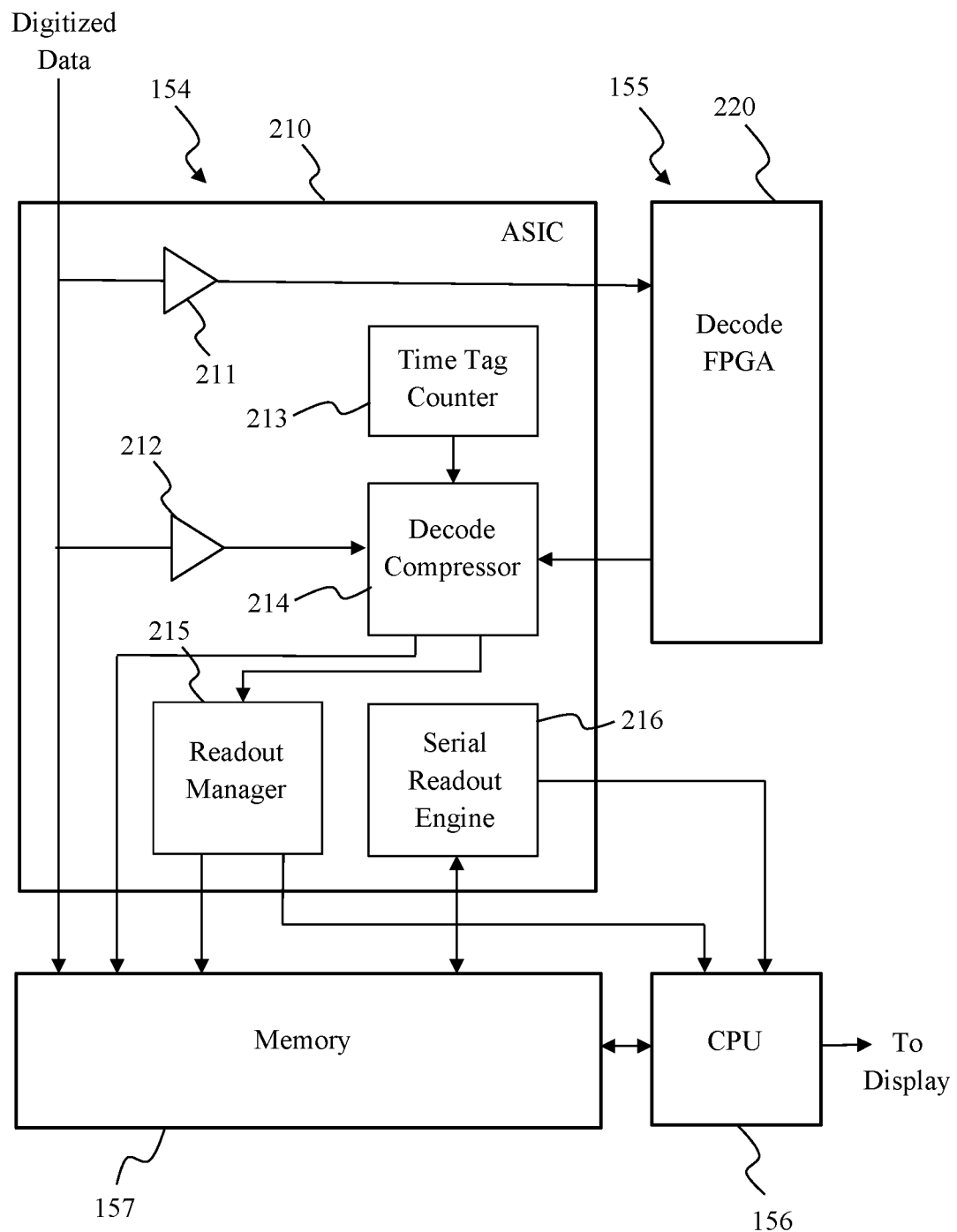
FIG. 2 is a simplified block diagram of a processing circuit and decoding circuit of the test system for providing the compressed decoded symbols, according to a representative embodiment.

FIG. 2 is a simplified block diagram of an illustrative processing circuit 154 and decoding circuit 155 of the test system 100 for providing compressed serial data, according to a representative embodiment.

In the illustrative embodiment shown in FIG. 2, the processing circuit 154 comprises representative ASIC 210, and the decoding circuit 155 comprises representative FPGA 220. Generally, the ASIC 210 receives digitized data, outputs the digitized data to the FPGA 220 for serial decoding, compresses decoded symbols input from the FPGA 220 to be stored as valid packets, and controls readout of data using the stored valid packets. In the depicted embodiment, the ASIC 210 includes a threshold comparator 211, trigger logic 212, a decode compressor 213, a time-tag counter 214, a readout manager 215 and a serial readout engine 216, which may be implemented as respective logic circuits, for example. Each of the logic circuits may include one or more logic gates, and the logic (algorithms) associated with each of these logic circuits may be implemented by the design/configuration of the one or more logic gates, as would be apparent to one having ordinary skill in the art. For example, the logic circuits may be implemented by hard-wired logic gates, hardware, software, firmware, or combinations thereof. Also, the layout of the logic gates may be derived from Hardware Description Language (HDL), for example, as would be apparent to one having ordinary skill in the art. In alternative embodiments, the algorithms may be stored as instructions in memory and executed by one or more microprocessors in the processing circuit 154 and/or the decoding circuit 155 in lieu of using the ASIC 210 and the FPGA 220, without departing from the scope of the present teachings.

The threshold comparator 211 receives digitized data, e.g., from the ADC 114, which includes integer voltage levels corresponding to the analog input signal from the DUT 160. The threshold comparator 211 compares the integer voltage levels of the digitized data to a predetermined voltage threshold, and outputs ones (high level) for the voltage levels exceeding the threshold and zeroes (low level) for the voltage levels not exceeding the thresholds to output a data stream of corresponding ones and zeros. The threshold comparator 211 sends the data stream to the FPGA 220 via a serial bus for serial decoding. In an embodiment, the data stream may be buffered by a first-in first-out (FIFO) buffer (not show) at the output of the ASIC 210 or at the input of the FPGA 220, depending on the volume of data and the processing speed of the FPGA 220. In addition, the FIFO buffer may be used to normalize latency along the transmission link.

Although FIG. 2 shows one threshold comparator 211, it is understood that the processing circuit 154 may include multiple threshold comparators to support various requirements, such as pulse amplitude modulation (PAM) decoding, for example, as would be apparent to one having ordinary skill in the art. Multiple threshold comparators may provide an interleaved data stream of comparator results from the same input channel with different thresholds and/or from multiple different input channels. For example, an interleaved data stream may include alternating comparison results of digitized data from a first measurement channel and a second measurement channel. Also, in alternative embodiments, when the input channel 110 is a digital channel (1-bit logic channel), for example, the data stream may be provided directly to the FPGA 220, without threshold comparison. In this case, the threshold comparator 211 is not required, and may be omitted from ASIC 210.

In the depicted embodiment, the trigger logic 212 identifies a trigger event using any compatible technique. For example, the trigger logic may receive the digitized data, e.g., from the ADC 114 or digital channel, and identify the trigger event in the received digitized data. Alternatively or additionally, the trigger logic 212 may receive decoded symbols from the FPGA 220, or information indicative of the decoded symbols, in which case the trigger logic 212 may identify the trigger event in response to the decoded symbols (e.g., receiving decoded symbol X). Also, the trigger logic 212 may receive the digitized data from the ADC 114 through an analog input channel for identifying the trigger event, while the FPGA 220 receives the data stream from a digital input channel. In response to the trigger event, the trigger logic 212 provides a trigger signal to the decode compressor 213 at a predetermined voltage level (e.g., a one or a zero) in response to the identification of the trigger event in the digitized data. The trigger logic 212 is discussed in more detail below. Notably, for ease of description, it is assumed that the digitized data includes one trigger event, although it is understood that the digitized data may include multiple trigger events, each of which is handled in a similar manner as described herein, without departing from the scope of the present teachings.

The FPGA 220 generates serial decoded symbols corresponding to digitized data in the incoming data stream. That is, the data stream is translated into symbols according to a predetermined serial communication protocol, such as I2C or SPI protocol, for example. The decoded symbols may include information such as target addresses, whether a transaction is a read or write transaction, and what data is transferred in the transaction, for example. Generally, the FPGA 220 executes predetermined logic (FPGA algorithm)

to convert the data stream into decoded symbols, which the FPGA 220 returns to the decode compressor 213 of the ASIC 210 in a decoded symbol stream via the same or a different serial bus. The decoded symbol stream from the FPGA 220 is a dense stream of symbols, meaning that the decoded symbol stream is continuous, and independent of acquisitions. That is, the FPGA 220 sends out a constant stream of decoded symbols with a consistent period between them, so that there is full time information with regard to the decoded symbols at this point. In an embodiment, the decoded symbol stream may pass through another FIFO buffer (not show), e.g., in order to normalize latency along the serial bus from the FPGA 220 to the ASIC 210. By normalizing latency, the time of trigger signal provided by the trigger logic 212 may be correlated from the digitized data stream to times of the decoded symbols in the decoded symbol stream at readout, discussed below. In an embodiment, the FPGA 220 may be a configurable FPGA, meaning that the FPGA 220 may be reconfigured with different logic in real-time or near real-time, e.g., by the CPU 156. This enables the FPGA 220 to perform serial decoding of multiple data streams according to different protocols simultaneously. Also, in the event that the FPGA 220 is not able to fit all the logic necessary to decode different protocols simultaneously, the reconfigurability enables the test system 100 to decode different protocols, and to receive firmware updates to support new protocols.

The decode compressor 213 receives the decoded symbols from the FPGA 220, and identifies "valid symbols" among the received decoded symbols. Valid symbols are the decoded symbols that indicate a transition between temporally adjacent decoded symbols. The remaining decoded symbols, which do not transition from a preceding decoded symbol, may be referred to as "invalid symbols" or "no operation symbols" ("NOOP symbols"). In an embodiment, the FPGA 220 provides indications as to whether the decoded symbols are valid symbols or invalid symbols, and the decode compressor 213 identifies the valid symbols based on these indications. For example, the FPGA 220 may send metadata along with the decoded symbols indicating whether the respective decoded symbols are valid or not. For example, the FPGA 220 may provide a metadata indication at the transition between decoded symbols (or at the occurrence of a decoded symbol), although the FPGA 220 may have the capability to arbitrarily decide which decoded symbols it sends bas as valid or invalid. In an alternative embodiment, the ASIC 210 (e.g., the decode compressor 213) may determine which of the decoded symbols received from the FPGA 220 are valid based on when the decoded symbols change values.

The decode compressor 213 stores the valid symbols in the memory 157, together with corresponding time-tags (timestamps) generated by the time-tag counter 214. The time-tag counter 214 is a global time-tag counter, which is very wide so that the entire time-tag counter cannot feasibly rollover during the runtime of the test system 100. The time-tags associate the valid symbols with the original times at which the valid symbols actually occur in the serial stream of the decoded symbols as received from the FPGA 220.

Because the decoded symbol stream is a dense stream of symbols, as discussed above, the decode compressor 213 is able to accurately correlate time with all of the decoded symbols, that is, valid symbols and invalid symbols. For example, the time-tag counter 214 may increment an 8-bit or 16-bit counter word for each decoded symbol received at the decode compressor 213, and actually assign time-tags indicated by the counter word to the valid symbols. The time-tagged valid symbols are referred to herein as "valid packets," which are stored in the memory 157. The decode compressor 213 discards the remaining decoded symbols (e.g., the invalid symbols), not identified as valid symbols, thereby reducing the amount of memory 157 needed to store decoded symbols. Although adding the time-tags to the valid symbols increases the size of each stored valid packet, the occurrence of the valid symbols is infrequent enough that including the time-tags and storing only the time-tagged valid symbols as valid packets is a net saver of memory and bandwidth. Accordingly, the decode compressor 213 effectively performs lossless compression of the serial steam of decoded symbols. Also, the decode compressor 213 may write a special symbol to the memory 157 at the start of an acquisition to indicate the most recent, valid symbol that it received. This may be useful when the acquisition begins in the middle of the valid symbol in order to show the valid symbol that was active at the start of the recorded waveform, even when all of the waveform that made up that valid symbol may not be available. For example, there may be no valid symbol that aligns with a left edge LE of the display screen 171. In this case, a most recent valid symbol that occurs before the left edge LE of the display screen 171 may be included as the valid symbol occurring between the left edge LE and a first valid symbol occurring after the time associated with the left edge LE.

Because the valid packets are stored with time-tags associated with the original times of occurrence of the valid symbols, the entire stream of decoded symbols may ultimately be recreated by placing the valid symbols at the corresponding times according to their time-tags, and filling in duplicate decoded symbols between the valid symbols by repeating the valid symbols, as discussed below. That is, starting with a valid packet, the corresponding valid symbol is repeated in each time slot until the next valid packet, indicating the next transition. The valid symbol from the next valid packet is then repeated as the duplicate decoded symbol in each time slot until the next valid packet, indicating the next transition, and so on.

Figure 3:
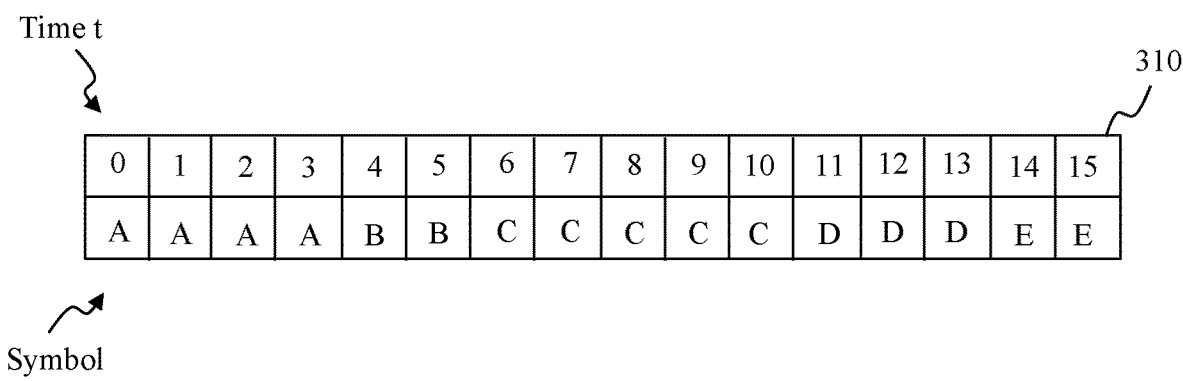
FIG. 3 shows an example of a stream of decoded symbols, as received from an FPGA, and a corresponding compressed stream of valid symbols, according to a representative embodiment.
Figure 3:
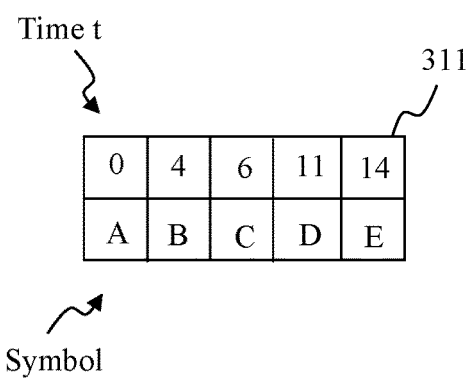

FIG. 3 shows an example of a stream 310 of decoded symbols, as received by the decode compressor 213 from the FPGA 220, and a corresponding compressed stream 311 of valid symbols as identified by the decode compressor 213. The decoded symbols in the stream 310 have corresponding time values 0-15 (in arbitrary units). In the depicted example, symbol A occurs at times t=0 to t=3, symbol B occurs at times t=4 to t=5, symbol C occurs at times t=6 to t=10, symbol D occurs at times t=11 to t=13, and symbol E occurs at times t=14 to t=15. Therefore, the valid symbols of the stream 310 include symbol A at time t=0 (transition from an unknown previous symbol to symbol A), symbol B at time t=4 (transition from symbol A to symbol B), symbol C at time t=6 (transition from symbol B to symbol C), symbol D at time t=11 (transition from symbol C to symbol D), and symbol E at time t=14 (transition from symbol D to symbol E). The decode compressor 213 stores the valid symbols with time-tags associated with the symbol times, thereby effectively reducing the stream 310 to the compressed stream 311, which includes only symbol A at time t=0, symbol B at time t=4, symbol C at time t=6, symbol D at time t=11, and symbol E at time t=14.

Meanwhile, the trigger logic 212 provides a trigger signal that identifies the trigger event in the digitized data (or in the decoded symbols) received at the ASIC 210, as discussed above. The trigger signal is also time-tagged (timestamped) by the time-tag counter 214 to mark the timing of the trigger event relative to the valid packets. So, in addition to storing the valid packets, the decode compressor 213 stores the time-tag of the trigger signal (even when no data actually occurs at that time) into the memory 157. Also, the decode compressor 213 identifies a last valid packet occurring prior to the end of the acquisition, which is some predetermined time offset after the trigger signal. A time-tag and address of the last valid packet are stored in the memory 157.

Notably, the capacity of the memory 157 is limited, and may be set up as a circular buffer, for example, that holds roughly the last K valid symbols. In this case, the circular buffer may be overwritten multiple times during an acquisition. Therefore, valid symbols, including those occurring around the trigger signal, may be overwritten. To assure that the times of all the valid symbols are not lost, full time tags are stored with all the valid symbols. Then, using the stored full time tag of the last valid symbol (or some other valid sample that has not yet been overwritten), and known relative times between the decoded symbols, the full times of all of the stored valid symbols may be calculated regardless of whether the stored valid symbols have been overwritten.

In an embodiment, in order to save memory, fewer than all (e.g., half) of the bits of the time-tag counter 214 may be stored with each valid packet in the memory 157. For example, only the least significant bits (LSBs) of the counter word may be stored, along with metadata indicating LSB rollover of the counter word, such that counting is performed using the LSBs while the most significant bits (MSBs) are disregarded. In this case, when the time-tag counter word is M bits wide, only N LSBs are stored with the valid packets, where N<M, where the values of M and N are optimized. When the LSBs overflow, a special counter overflow packet is written into memory as the metadata, and the LSBs rollover to zero in order to continue counting, thereby using less memory. Although slightly complicating readout, the LSB rollover functionality may be optimized to reduce the amount of non-data bits stored into the memory 157.

For example, when the counter word is implemented as 16-bit word, the counting is performed using bits 0-7 (LSBs), while the remaining bits 8-15 (MSBs) of the counter word are disregarded. When the LSBs of the counter word reach 1111 1111, a special overflow packet is written to the memory 157 to indicate rollover of the LSBs, which are reset to 0000 0000. Accordingly, half of the counter bits and the corresponding metadata indicating LSB rollover are stored into the memory 157.

The readout manager 215 receives the trigger time-tag from the decode compressor 213. The readout manager 215 is configured (e.g., by software) with a desired offset of a left edge LE of the display screen 171 from the trigger time-tag and a width W of the display screen 171. The readout manager 215 derives a first point time-tag from the trigger time-tag and the desired offset, and derives a last point time-tag from the first-point time-tag and a desired duration of the readout, where the first point time-tag indicates a first time corresponding to the left edge LE and the last point time-tag indicates a second time corresponding to a right edge RE of the display screen 171. The readout manager 215 may receive indication of the desired duration of the readout from the interface 158.

For example, the readout manager 215 may work backward in the memory 157 from the trigger time-tag by the desired offset to identify the first point time-tag, factoring in constant latencies in the processing circuit 154 (e.g., between the trigger path and the storage path) and display parameters such as horizontal scaling set by the user via the interface 158. The readout manager 215 may then work forward from the first point time-tag over the desired duration to identify the last point time-tag, again factoring in constant latencies and display parameters, such as the horizontal scaling. For example, the readout manager 215 may sum the first point time-tag and the desired duration to obtain the last point time-tag. The readout manager 215 stores the first point time-tag and the last point time-tag in the memory 157 and/or provides the first point time-tag and the last point time-tag to the CPU 156. The memory 157 also receives the time-tag and the address of the last valid packet from the decode compressor 213, as mentioned above.

The serial readout engine 216 retrieves the stored valid packets from the memory 157, and identifies addresses that correspond to the valid packets that occur immediately before the first point time-tag and the valid packets that occur at or immediately before the last point time-tag, respectively. That is, the serial readout engine 216 identifies the last valid packet among the valid packets stored in the memory 157 by the decode compressor 213. The serial readout engine 216 then reads the memory 157 backward from a last address of the identified last valid packet to identify a beginning valid packet, which is the stored valid packet having a time-tag (beginning time-tag) that occurs immediately before the first point time-tag. The serial readout engine 216 then reads the memory 157 forward from a beginning address of the identified beginning valid packet out to the CPU 156. In particular, the serial readout engine 216 reads the valid packets from the memory 157 to an ending valid packet, which is the stored valid packet having a time-tag (ending time-tag) that occurs at or before the last point time-tag. As used herein, the beginning time-tag occurring immediately before the first point time-tag refers to the first time-tag encountered working backward in the memory 157 from the first point time-tag, and the ending time-tag occurring at or immediately before the last point time-tag refers to the first time-tag encountered working forward in the memory 157 from the last point time-tag. An ending address of the ending valid packet is also provided to the CPU 156.

The CPU 156 plots a signal on the display screen 171 using the valid packets and repeating the valid symbols from the valid packets as duplicate decoded signals in place of the invalid symbols received from the FPGA 220 that were not stored. That is, the CPU 156 effectively decompresses a sparse stream of valid packets (valid symbols plus metadata) into a symbol stream that can be filled in and plotted to correspond to the input signal.

In particular, the CPU 156 receives from the readout manager 215 (or the memory 157) the first point time tag (corresponding to the left edge LE of the display screen 171), the last point time tag (corresponding to the right edge RE of the display screen 171), and the trigger time-tag (corresponding to the trigger signal). The CPU 156 retrieves from the memory 157 the valid packets from the previously determined beginning valid packet to the ending valid packet, and plots these valid packets on the display screen 171. The CPU 156 uses the beginning valid packet (which will be to the left of left edge LE of the display screen 171) to "draw into" the display screen 171, and then plot each valid packet until the CPU 156 reaches the ending valid packet (which will be to the right of the right edge RE of the display screen 171). The CPU 156 uses the first point time tag, the last point time tag, and the trigger time-tag to understand the size of the display screen 171 in time tag units, and to determine how to relatively place the decoded symbols. For example, when the first point time tag is 1000 and the last point time tag is 2000, the CPU 156 identifies the display screen 171 as being 1000 time tag units wide. Then, assuming the display screen 171 is N pixels wide, the CPU 156 converts from time tag units to pixels, and normalizes by subtracting the first point time tag to provide proper placement on the display screen 171.

In addition, because the valid packets include only decoded symbols indicative of transitions between adjacent decoded symbols, the CPU 156 also repeats the valid symbols from the valid packets to plot between the valid packets, effectively decompressing the decoded symbols received from the FPGA 220. The repeated valid symbols (duplicate symbols) are the same as the valid symbol from the most recent valid packet, and are repeated until the next valid packet, as discussed above. Therefore, different decoded symbols are repeated following each valid packet. The CPU 156 may simultaneously plot out the digitized data, e.g., received from the ADC 114 or the digital channel, stored into the memory 157. For example, the CPU 156 may plot the digitized data together with these decoded symbols by converting the digitized data to pixels to accurately show relative timings of the decoded symbols and the digitized data, as well as relative timings of the decoded symbols and/or the digitized data to the trigger. In order to have the analog view, the user may double-probe the SUT using an analog channel and a digital channel, or may use a probe that provides both types of connections, for example.

Figure 4:
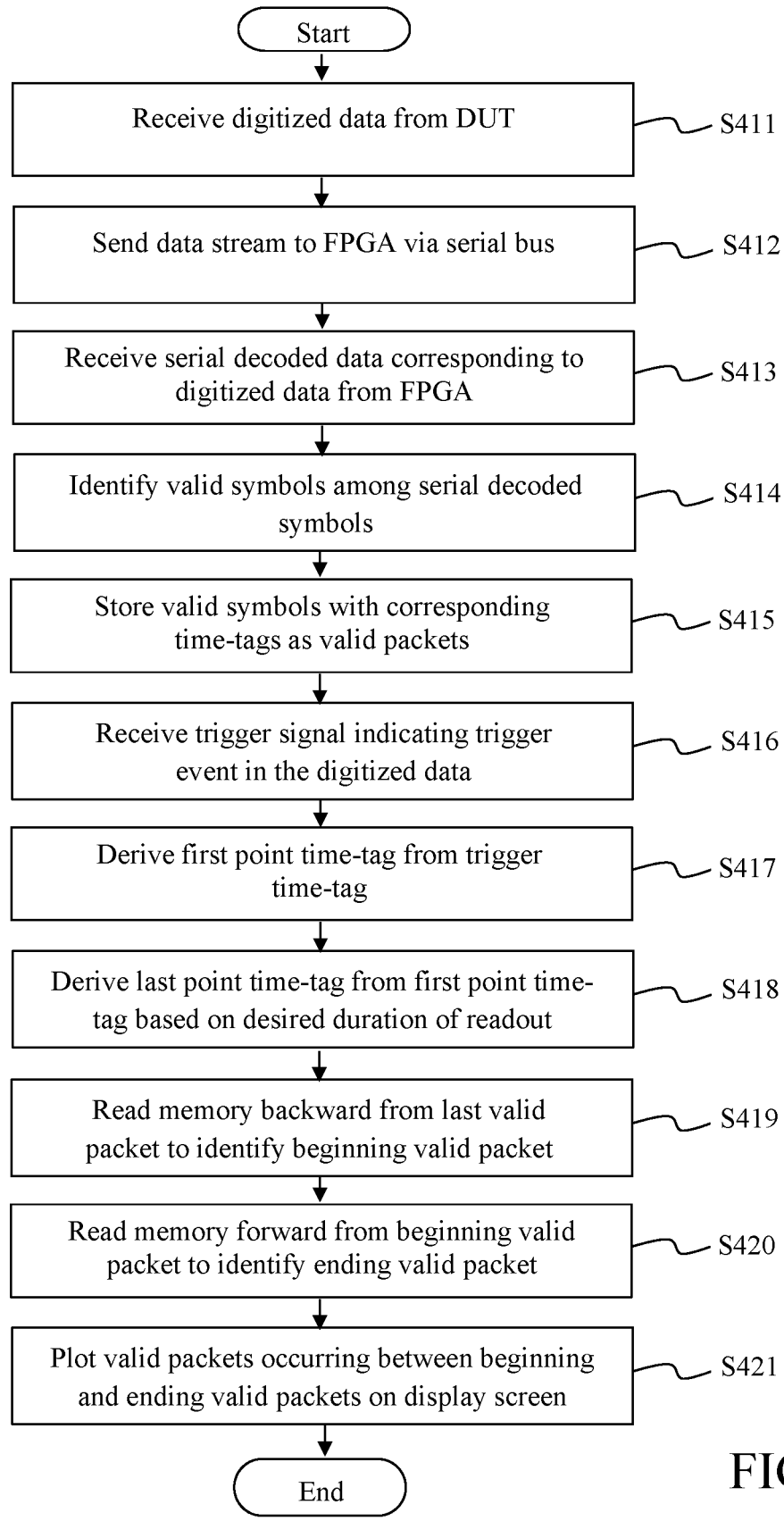
FIG. 4 is a simplified flow diagram of a method for displaying input signals from a DUT using compressed decoded symbols, according to a representative embodiment.

FIG. 4 is a flow diagram illustrating a method for displaying input signals from a DUT using compressed decoded symbols, according to a representative embodiment. The method may be implemented by the processing unit 150, for example, where the method steps are provided by logic implemented by the processing circuit 154, the decoding circuit 155 and/or by instructions executable by the CPU 156. The input signals of the acquisition may be displayed on display screen 171 of the display 170, for example.

Referring to FIG. 4, digitized data from the DUT is received through a measurement channel in block S411. The digitized data may be serial data received at an ASIC or other processing circuit through a measurement channel of an oscilloscope or other test instrument, for example. In an embodiment, the digitized data is input to a threshold comparator, which provides a data stream of ones and zeros corresponding to voltage levels of the digitized data.

In block S412, the data stream is sent by serial data transmission to an FPGA or other decoding circuit for serial decoding. The serial decoding includes translating the data stream into a serial communication protocol, such as I2C or SPI protocol, for example. The data stream may be buffered at the output of the ASIC or the input of the FPGA, for example.

In block S413, decoded symbols corresponding to the digitized data are received from the FPGA. The stream of decoded symbols may be buffered at the output of the FPGA or the input of the ASIC, for example.

In block S414, valid symbols are identified among the decoded symbols. The valid symbols are decoded symbols that indicate transitions between temporally adjacent decoded symbols received from the FPGA, an example of which is shown in FIG. 3. The remaining decoded symbols, occurring between the valid symbols, may be referred to as invalid or NOOP symbols.

In block S415, the valid symbols are stored with corresponding time-tags as valid packets in memory, and the invalid symbols occurring between the valid symbols are discarded. The time-tags associate the valid symbols with the original times at which the valid symbols occur in the decoded symbol stream from the FPGA, taking into account the times of the discarded invalid symbols. That is, the time-tags may be generated by a time-tag counter to correlate times to all of the decoded symbols, although only the time-tags associated with the valid symbols are actually stored. Accordingly, the valid symbols ultimately may be reassembled in their corresponding time slots relative to all of the decoded symbols, even though the invalid symbols have not been stored.

In block S416, a trigger signal is received indicating a trigger event in the digitized data, along with a trigger time-tag indicating the time of the trigger event. The trigger signal and the trigger time-tag may also be stored in the memory. The trigger time-tag may be generated by the same time-tag counter that generates the valid symbol time-tags, for example.

In block S417, a first point time-tag is derived from the trigger time-tag. The first point time-tag indicates a first time corresponding to a left edge of a display screen, such as the display screen 171, for example. The trigger time-tag may include a relative time between the left edge of the display screen and the trigger event, such that the first point time-tag may be derived by working backward from the trigger time-tag by the relative time to identify the first point time-tag. Deriving the first point time-tag factors in constant latencies and display parameters, such as horizontal scaling, set by the user via a user interface.

In block S418, a last point time-tag is derived from the first point time-tag based on a desired duration of the acquisition readout. The last point time-tag indicates a second time corresponding to a right edge of the display screen, such as the display screen 171, for example. The desired duration of the acquisition may be provided by a user via the user interface, for example. The last point time-tag may be derived by essentially adding the desired duration to the first point time-tag, factoring in the display parameters, such as the horizontal scaling, for example.

In block S419, the memory is read backward from a last valid packet of the stored valid packets to identify a beginning valid packet of the stored valid packets. The beginning valid packet is the stored valid packet that occurs at a time immediately before the first point time-tag, as indicated by the corresponding time-tag of the beginning valid packet.

In block S420, the memory is read forward from the beginning valid packet to identify an ending valid packet of the stored valid packets. The ending valid packet is the stored valid packet that occurs at a time at or immediately before the previously determined last point time-tag, as indicated by the corresponding time-tag of the ending valid packet.

In block S421, a symbol stream is plotted on the display screen, e.g., by CPU 156, where the symbol stream includes valid symbols from the stored valid packets occurring between the beginning valid packet and the ending valid packet, and duplicate decoded symbols repeatedly inserted between the valid symbols. Plotting the valid symbols is based on the first point time-tag, the last point time-tag, the trigger time-tag, the length of the display screen, the beginning time-tag corresponding to the beginning valid packet, and the ending time-tag corresponding to the ending valid packet the ending valid packet, as discussed above. In addition, because the stored valid packets include only the valid symbols indicative of transitions between temporally adjacent decoded symbols, the valid symbols are repeated as duplicate decoded symbols following each of the valid symbols. That is, the same decoded symbol of the most recent valid packet is repeated until the next valid packet, after which the same decoded symbol of the next valid packet is repeated until still the next valid packet, and so on, until the end of the plot.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit" or "system." Furthermore, aspects of the present invention may take the form of a computer program product embodied in one or more computer readable medium(s) having computer executable code embodied thereon.

While representative embodiments are disclosed herein, one having ordinary skill in the art appreciates that many variations that are in accordance with the present teachings are possible and remain within the scope of the appended claim set. The invention therefore is not to be restricted except within the scope of the appended claims.

The invention claimed is:

1. A method of displaying input signals from a device under test (DUT) on a display screen, the method comprising:
    sending a data stream of digitized data received from the DUT to a decoding circuit for serial decoding;
    receiving decoded symbols from the decoding circuit corresponding to the digitized data;
    identifying valid symbols among the decoded symbols indicating transitions between the decoded symbols;
    storing the valid symbols with corresponding time-tags as valid packets in a memory, and discarding ones of the decoded symbols occurring between the valid symbols; and
    plotting on the display screen the valid symbols from the valid packets from a beginning valid packet of the stored valid packets to an ending valid packet of the stored valid packets, together with duplicate decoded symbols repeating the valid symbols from the valid packets, respectively, between the valid packets,
    wherein the beginning valid packet has a corresponding time-tag occurring immediately before a first point time-tag associated with a left edge of the display screen, and the ending valid packet has a corresponding time-tag occurring at or immediately before a last point time-tag associated with a right edge of the display screen.

2. The method of claim 1, further comprising:
    receiving a trigger time-tag corresponding to occurrence of a trigger;
    deriving the first point time-tag from the trigger time-tag; and
    deriving the last point time-tag from the first point time-tag based on a desired duration of a read-out.

3. The method of claim 2, further comprising:
    reading the memory backward from a last valid packet of the stored valid packets to identify the beginning valid packet of the stored valid packets; and
    reading the memory forward from the beginning valid packet to identify the ending valid packet of the stored valid packets.

4. The method of claim 1, further comprising:
    determining times corresponding to the valid symbols, as well as invalid symbols of the decoded symbols occurring between the valid symbols, using a time-tag counter, and generating time-tags for the valid symbols but not the invalid symbols.

5. The method of claim 4, wherein generating the time-tags comprises:
    providing sequentially least significant bits (LSBs) from the time-tag counter as the time-tags for the decoded symbols respectively; and
    providing overflow packets from the time-tag counter indicating rollover of only the LSBs to most significant bits (MSBs), the overflow packets indicating new values of the MSBs of the time-tags.

6. The method of claim 1, wherein the decoding circuit comprises a configurable field programmable gate array (FPGA).

7. A system for displaying input signals from a device under test (DUT), the system comprising:
    a display screen;
    a decoding circuit configured to serially decode a data stream;
    a processing circuit configured to receive digitized data from the DUT, and to send the digitized data as the data stream to the decoding circuit for the serial decoding, wherein the processing circuit comprises:
        a time-tag counter configured to generate time-tags;
        a serial decode compressor configured to:
            receive decoded symbols from the decoding circuit corresponding to the serially decoded data stream,
            identify valid symbols among the decoded symbols indicating transitions between the decoded symbols,
            store the valid symbols with corresponding time-tags from the time-tag counter in a memory as valid packets,
            discard ones of the decoded symbols occurring between the valid symbols,
            receive a trigger signal indicating occurrence of a triggering event, and
            associate the trigger signal with a trigger time-tag from the time-tag counter;
        a readout manager configured to:
            derive a first point time-tag from the trigger time-tag, the first point time-tag indicating a time corresponding to a left edge of the display screen, and
            derive a last point time-tag from the first point time-tag and a desired duration of a read-out, the last point time-tag indicating a second time corresponding to a right edge of the display screen; and
        a serial readout engine configured to:
            read the memory backward from an address of a last valid packet of the stored valid packets to identify a beginning valid packet occurring before the first point time-tag, and read the memory forward from the beginning valid packet to identify an ending valid packet of the stored valid packets occurring at or immediately before the last point time-tag; and a central processing unit (CPU) configured to plot on the display screen the valid packets, occurring from the beginning valid packet to the ending valid packet, together with duplicate decoded symbols repeating the valid symbols from the valid packets, respectively, between the valid packets.

8. The system of claim 7, wherein the decoding circuit comprises a configurable field programmable gate array (FPGA).

9. The system of claim 8, wherein the processing circuit comprises an application-specific integrated circuit (ASIC).

10. The system of claim 7, wherein the readout manager derives the first point time-tag by working backward in the memory from the trigger time-tag to identify the first point time-tag, factoring in constant latencies and display parameters.

11. The system of claim 10, wherein the readout manager derives the last point time-tag by adding the desired duration to the first point time-tag.

12. The system of claim 11 further comprising:
a user interface configured to receive information from and provide information to the decoding circuit, the processing circuit and/or the CPU, wherein the desired duration of the read-out is provided by a user via the user interface.

13. The system of claim 7, wherein the time-tag counter is configured to provide sequentially least significant bits (LSBs) as the time-tags for the decoded symbols respectively, and to provide overflow packets indicating rollover of the LSBs to most significant bits (MSBs), the overflow packets indicating new values of the MSBs of the time-tags.

14. The system of claim 7, further comprising:
a first-in first-out (FIFO) buffer at an output of the processing circuit at an input of the decoding circuit to buffer the data stream depending on a volume of data and a processing speed of the decoding circuit.

15. The system of claim 7, wherein the decoding circuit is further configured to send metadata with the decoded symbols indicating the valid symbols.

16. The system of claim 7, wherein the CPU is further configured to plot on the display screen the digitized data received from the processing circuit and stored into the memory.

17. A method of displaying input signals from a device under test (DUT) on a display screen, the method comprising:

sending a data stream of digitized data from the DUT to a field programmable gate array (FPGA) for serial decoding;

receiving decoded symbols from the FPGA corresponding to the digitized data;

identifying valid symbols among the decoded symbols indicating transitions between the decoded symbols;

storing the valid symbols with corresponding time-tags as valid packets in a memory, and discarding ones of the decoded symbols occurring between the valid symbols;

receiving a trigger time-tag corresponding to occurrence of a trigger;

deriving a first point time-tag from the trigger time-tag, the first point time-tag indicating a first time corresponding to a left edge of the display screen;

deriving a last point time-tag from the first point time-tag based on a desired duration of a read-out, the last point time-tag indicating a second time corresponding to a right edge of the display screen;

reading the memory backward from a last valid packet of the stored valid packets to identify a beginning valid packet of the stored valid packets occurring immediately before the first point time-tag;

reading the memory forward from the beginning valid packet to identify an ending valid packet of the stored valid packets occurring at or immediately before the last point time-tag; and plotting on the display screen the valid packets, occurring from the beginning valid packet to the ending valid packet, together with duplicate decoded symbols repeating the valid symbols from the valid packets, respectively, between the valid packets.

18. The method of claim 17, wherein storing the valid symbols with the corresponding time-tags comprises:
receiving sequentially least significant bits (LSBs) from a time-tag counter as the time-tags corresponding to the valid symbols to be stored respectively; and
receiving overflow packets from the time-tag counter indicating rollover of the LSBs to most significant bits (MSBs), the overflow packets indicating new values of the MSBs of the time-tags.

19. The method of claim 17 further comprising buffering the data stream using a first-in first-out (FIFO) buffer to normalize latency.

20. The method of claim 17, wherein deriving the first point time-tag comprising working backward in the memory from the trigger time-tag to identify the first point time-tag, factoring in constant latencies and display parameters.

* * * * *